United States Patent
Okamoto

(10) Patent No.: US 6,752,662 B2
(45) Date of Patent: Jun. 22, 2004

(54) PRINTED CIRCUIT BOARD MOUNTED ELECTRICAL CONNECTOR

(75) Inventor: Toshimune Okamoto, Isesaki (JP)

(73) Assignee: Hosiden Corporation, Osaka (JP)

( * ) Notice: Subject to any disclaimer, the term of this patent is extended or adjusted under 35 U.S.C. 154(b) by 114 days.

(21) Appl. No.: 10/150,286

(22) Filed: May 17, 2002

(65) Prior Publication Data

US 2002/0173202 A1 Nov. 21, 2002

(30) Foreign Application Priority Data

May 18, 2001 (JP) ........................................ 2001-148820
Jun. 6, 2001 (JP) ........................................ 2001-171116

(51) Int. Cl.[7] .......................................... H01R 13/648
(52) U.S. Cl. ......................... 439/607; 439/62; 439/79; 439/660; 439/55; 439/541.5
(58) Field of Search .................... 439/79, 62, 607, 439/660, 55, 59, 61, 65, 541.5

(56) References Cited

U.S. PATENT DOCUMENTS

| | | | | |
|---|---|---|---|---|
| 5,322,447 A | * | 6/1994 | Okada | 439/79 |
| 5,800,204 A | * | 9/1998 | Niitsu | 439/495 |
| 5,954,536 A | * | 9/1999 | Fuerst et al. | 439/493 |
| 6,095,865 A | * | 8/2000 | Wu | 439/607 |
| 6,109,934 A | * | 8/2000 | Madsen et al. | 439/79 |
| 6,129,562 A | * | 10/2000 | Hong | 439/79 |
| 6,293,818 B1 | * | 9/2001 | Kim et al. | 439/495 |
| 6,319,062 B1 | * | 11/2001 | Ma et al. | 439/607 |
| 6,435,912 B1 | * | 8/2002 | Zhu et al. | 439/607 |

FOREIGN PATENT DOCUMENTS

| | | |
|---|---|---|
| JP | 1161583 | 11/1989 |
| JP | 10270107 | 10/1998 |
| JP | 20002770193 | 10/2000 |

* cited by examiner

Primary Examiner—Truc Nguyen
(74) Attorney, Agent, or Firm—Webb Ziesenheim Logsdon Orkin & Hanson P.C.

(57) ABSTRACT

A printed circuit board mounted electrical has a metal housing (20) defining, at one end thereof, a connecting opening (21) for receiving a mating connector. The housing includes a pair of right and left side walls (20a) and at least one horizontal wall (20b) interconnecting the side walls. The side walls and said horizontal wall together enclose a board segment (11) having a terminal land (11a) which is formed at a portion of a printed circuit board (10) and which also is capable of directly contacting the mating connector. A fixing piece (23) extends from each side wall (20a), the fixing piece having an attaching face (23a) which is to be placed on and solder-fixed to a solder attaching land (15) formed on the circuit board (10).

16 Claims, 14 Drawing Sheets

PRINTED CIRCUIT BOARD MOUNTED ELECTRICAL CONNECTOR

BACKGROUND OF THE INVENTION

1. Field of the Invention

The present invention relates to a printed circuit board mounted electrical connector including a metal housing which forms, at an outer end thereof, a connecting opening for receiving a mating connector. The metal housing includes a pair of right and left side walls and at least one horizontal wall interconnecting the side walls. The side walls and the horizontal wall together enclose a terminal which can be connected directly to the mating connector.

2. Description of the Related Art

With continued reduction of the thickness of electronic apparatuses, it has been increasingly desired to mount a greater variety and number of component devices on the surface of a printed circuit board. In some cases, even such component as a connector jack for connection to a power source or an external instrument is mounted directly on the printed circuit board. However, unlike other devices such as circuit elements surface-mounted on the board, such thickness reduction is difficult for a connector jack or plug. This difficulty results in hampering the desired thickness reduction of the entire printed circuit board or the electronic apparatus as a whole.

In order to solve the above problem, according to e.g. a printed circuit board mounted connector disclosed by the Japanese utility model application laid open under No. Hei. 1-161583, the printed circuit board is provided with a board segment forming a terminal land for connection to an external instrument. Further, a resin housing which is configured to be detachably attachable is attached to the circuit board in such a manner as to enclose the board segment. In use, a terminal of a jack or a plug as a mating connector is contacted with the terminal land for establishing required electrical connection. With this connector construction, the terminal of the mating connector and the terminal land of the board segment are directly connected to each other as described above. Hence, it is possible to omit such additional components as a contact for relaying the electrical connection between the terminal and the terminal land or a retaining element for retaining the connection and to omit manufacture, assembly or soldering associated with and required by such additional components. Hence, it is relatively easy to achieve reduction in cost and size of the connector.

Notwithstanding the above, the conventional connector construction suffers a problem as follows. Namely, in this connector construction, in order to prevent inadvertent detachment of the housing from the circuit board, the housing includes at a deep inner portion thereof, a projection engageable into an associated hole defined in the circuit board. This projection may be subjected to a concentrated stress during insertion or removal of the connector to or from the mating connector, often resulting in fracture of the projection. In order to avoid this, it is necessary to provide adequate reinforcement in the periphery of the projection. Such reinforcement, however, will again hinder the desired thickness reduction of the printed circuit board mounted connector.

The prior art has proposed another printed circuit board mounted connector disclosed by Japanese patent application laid open under No. Hei. 10-270107. This connector includes a body as a housing which can be attached to a cutout defined at a base end of the printed circuit board. The body includes a retained portion to be retained to a jack or a plug of the mating connector, and a binding portion for vertically binding the circuit board for retaining the board in the thickness direction thereof. The body further includes an engaging element engageable with a locking cutout portion formed within a cutout of the printed circuit board. In use of this surface mounted connector, the binding portion acts to support the thickness-wise center of the housing (body) to the printed circuit board, so that the projecting height of the connector relative to the circuit board is divided into one portion projecting upward from the front side of the board and the other portion projecting downward from the back side of the same.

However, this printed circuit board mounted connector also suffers the same problem as the first type mentioned above. Namely, in order to effectively withstand the force which may be applied in any direction in association with insertion or removal of the mating connector jack or plug, reinforcement is needed, particularly for the engaging element. In any case, the constructions of the retaining portions of these conventional connectors do not contribute to desired thickness reduction of the printed circuit board amounted electrical connector.

SUMMARY OF THE INVENTION

Hence, a primary object of the present invention is to provide a printed circuit board mounted electrical connector which can effectively withstand a force which may be applied thereto in any direction in association with insertion or removal of the jack or plug of the mating connector and which also can contribute to the thickness reduction of the connector.

For fulfilling the above-noted object, according to the present invention, a printed circuit board mounted electrical connector comprises a metal housing which forms, at an outer end thereof, a connecting opening for receiving a mating connector. The metal housing includes a pair of right and left side walls and at least one horizontal wall interconnecting the side walls. The side walls and the horizontal wall together enclose a terminal which is formed at a portion of the circuit board and which can be connected directly to the mating connector. The connector further comprises a fixing piece extending from each of the side walls, the fixing piece having an attaching face configured to be placed on and solder-fixed to a solder attaching land formed in the circuit board.

With this construction, the housing defining the connecting opening into or from which the jack or plug of the mating connector is inserted or removed is formed of metal and this metal housing integrally forms the fixing pieces described above. Therefore, even if the connector is formed thin, the connector can still provide sufficient strength for withstanding a force applied thereto in association with insertion or removal of the mating connector. Especially, as the fixing pieces provided to the metal housing are placed and solder-fixed to the solder attaching land of the circuit board, the housing can be fixed in position in a secure manner. Moreover, such fixing by means of soldering requires relatively short height, thus not hindering desired thickness reduction of the connector.

According to one preferred embodiment of the invention, said terminal to be connected to the mating connector is provided in the form of a terminal land formed on a board segment extending from the circuit board. This construction provides an advantage of allowing the terminal to be formed integrally with the circuit board.

According to another preferred embodiment, each said side wall includes at least one binding portion for binding the front and back sides of the circuit board. With this construction, as the binding portions for vertically binding the circuit board are formed in the metal housing having high strength, formed preferably integrally therewith, the binding portions, even when formed thin, can still provide sufficient strength. Further, if a pair of such binding portions are provided respectively at the proximal end and the distal end of the housing, this arrangement will further strengthen the attachment of the housing to the circuit board. Advantageously, an entrance area of a board inserting slot of the binding portion may be provided with an increased width for guiding or facilitating its insertion into the circuit board. In this case, if the width of the remaining portion of the board inserting slot is adapted to correspond to the thickness of the circuit board, the binding portion may be firmly retained without looseness.

According to a still further embodiment of the invention, the housing further includes a bottom wall at an inner end thereof, the bottom wall defining an insertion opening for allowing insertion of the board segment.

With this construction, the metal housing includes the bottom wall and this bottom wall defines an insertion opening for the board segment. Hence, the metal housing is provided substantially in the form of a box having even higher strength. Further, if the binding portion for binding the board segment inserted into the insertion opening is provided in the form of a slot extending continuously from an insertion opening defined at an end of the side wall of the housing, it becomes possible to minimize the opening which may allow entrance of a foreign object into the housing.

Further, if the housing is provided in the form of an angular tube formed of the opposed side walls and a pair of upper and lower horizontal walls, a spacer made of dielectric material may be interposed between the board segment inserted into the housing and the upper horizontal wall and between the board segment and the lower horizontal wall, respectively. This arrangement provides the advantage of restricting unnecessary displacement between the board segment and the housing. Moreover, if this spacer is configured so as to close the inner space of the housing, the spacer may act as a "barrier" for preventing entrance of foreign object into the housing.

According to still another preferred embodiment of the present invention, a printed circuit board mounted electrical connector comprises a metal outer housing having a pair of right and left side walls and at least one horizontal wall interconnecting the side walls, an inner housing accommodated and held within the outer housing, a connecting opening defined at an outer end of the outer housing for receiving a mating connector, and a terminal base having a contact capable of directly contacting the mating connector, the terminal base being enclosed and held within the inner housing; wherein the outer housing includes at least one binding portion for binding front and back faces of the circuit board and from each of the side walls, there extends a fixing piece having an attaching face configured to be placed on and solder-fixed to a solder attaching land formed in the circuit board.

In the case of this connector construction, the housing consists of an outer housing and an inner housing, and the binding portion and the fixing piece are formed in the metal outer housing, not in the inner housing which is generally formed of e.g. a resin material. Therefore, even when the construction is formed thin, the construction yet provides sufficient strength for withstanding the force generated in association with insertion or removal of the mating connector. Consequently, it is possible to restrict mechanical looseness of the housing relative to the circuit board and also to prevent inadvertent detachment of the solder-connected portion for the electrical connection between this connector and the circuit board or breakage of the body of the connector as well. That is, as the binding portion for vertically binding the circuit board is provided in the metal outer housing which has greater strength than the inner housing formed generally of resin or the like, the binding portion, even when formed thin, can provide sufficient strength against the force applied externally thereto. Moreover, as the fixing piece also provided in this outer metal housing is placed and solder-fixed to the solder attaching land of the circuit board, the metal outer housing can be securely fixed to the circuit board. In addition, since such fixing by means of soldering requires relatively short height, as compared with other mode of fixing using a screw for instance, this construction can contribute to the goal of thickness reduction of the printed circuit board amounted electrical connector. The binding portion may be formed on the side of each side wall adjacent the Circuit board or on the side thereof distant therefrom, depending on the required attachment strength. The binding portion may be readily formed for example by defining a slit corresponding to the thickness of the circuit board in the side wall of the outer housing.

The binding portion may be formed by defining a slit having a width corresponding to the thickness of the circuit board at an end of each of the right and left side walls of the outer housing. Alternatively, this binding portion may be formed by bending a portion of the right and left side walls of the outer housing to form a rib or the like and then defining a slit in this rib or the like. In any case, when compared with a construction in which a separate binding portion or member is attached to the outer housing, the above proposed integral constructions achieve the advantage of reducing the number of elements required and correspondingly reducing the number of steps required for the assembly of the construction.

Further and other features and advantages of the present invention will become apparent from the following detailed disclosure with reference to the accompanying drawings.

DESCRIPTION OF THE PREFERRED EMBODIMENTS

A first embodiment of a printed circuit board mounted electrical connector (to be referred to simply as "connector" hereinafter) relating to the present invention will be described with reference to FIGS. 1 through 15.

Figure 1A:
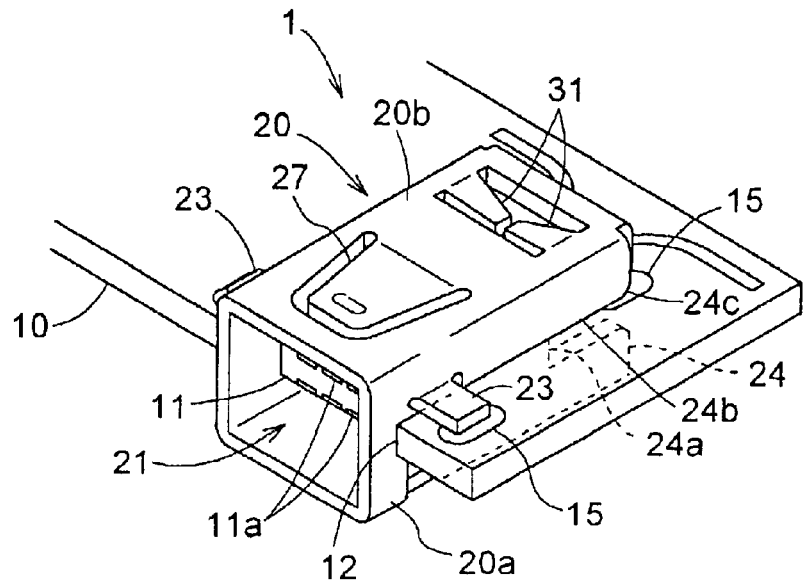
FIGS. 1A and 1B are perspective views showing a first embodiment of a connector relating to the present invention.
Figure 1B:
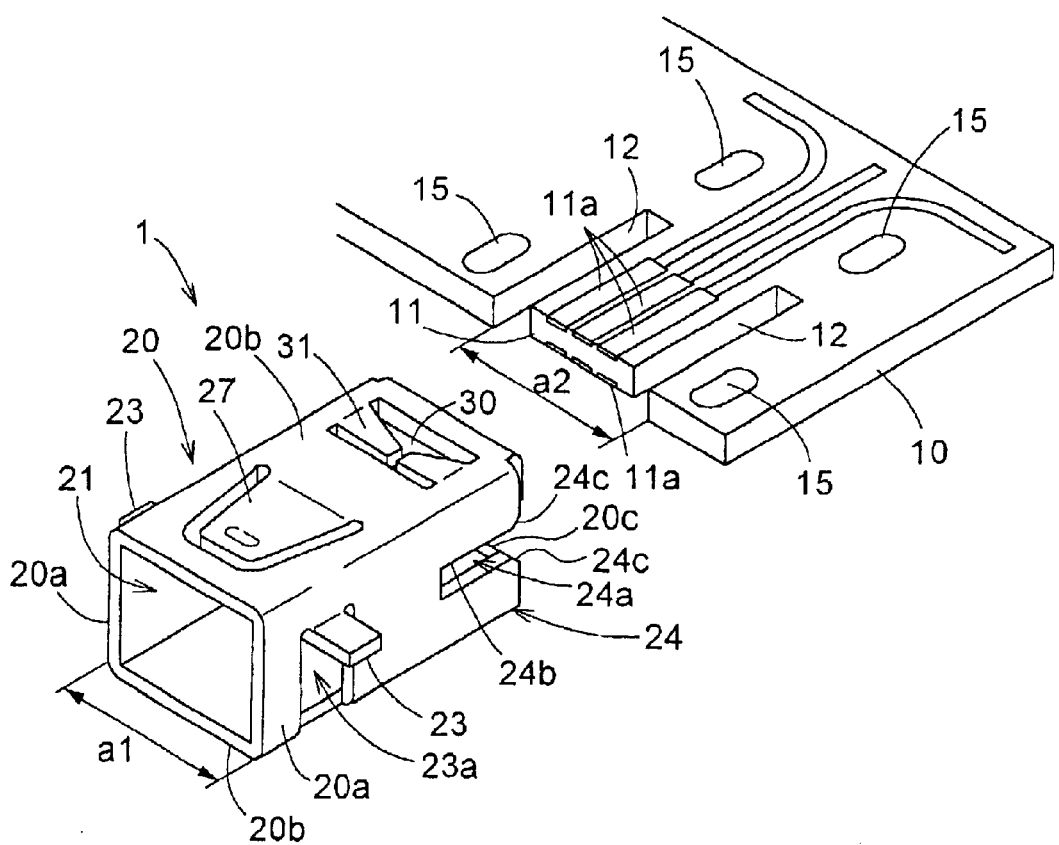
Figure 2:
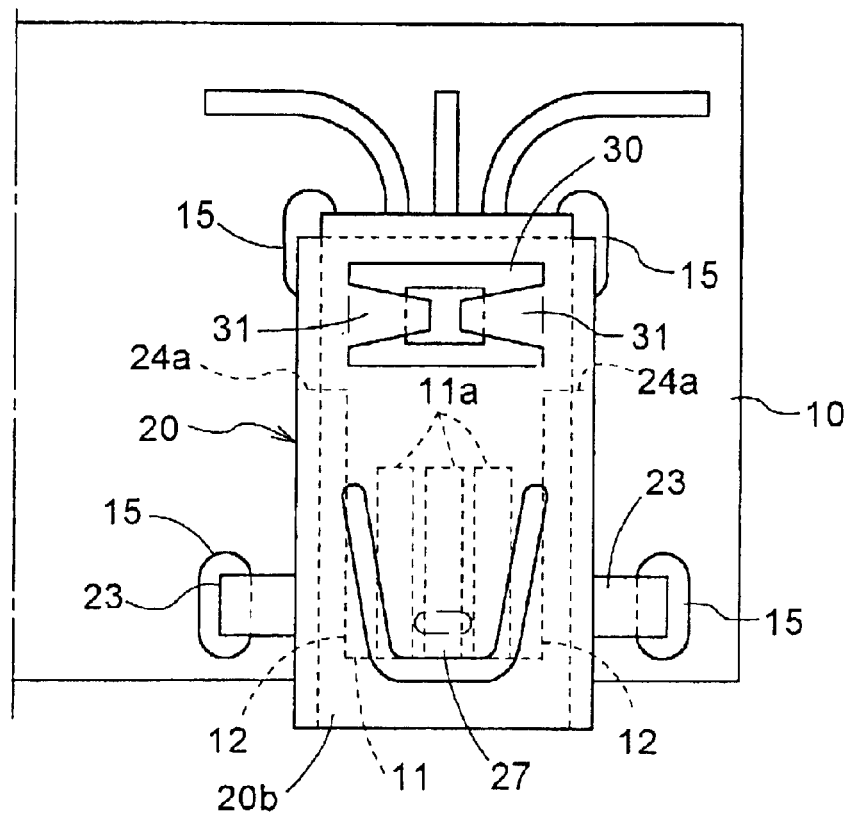
FIG. 2 is a plan view of the connector shown in FIG. 1.
Figure 3:
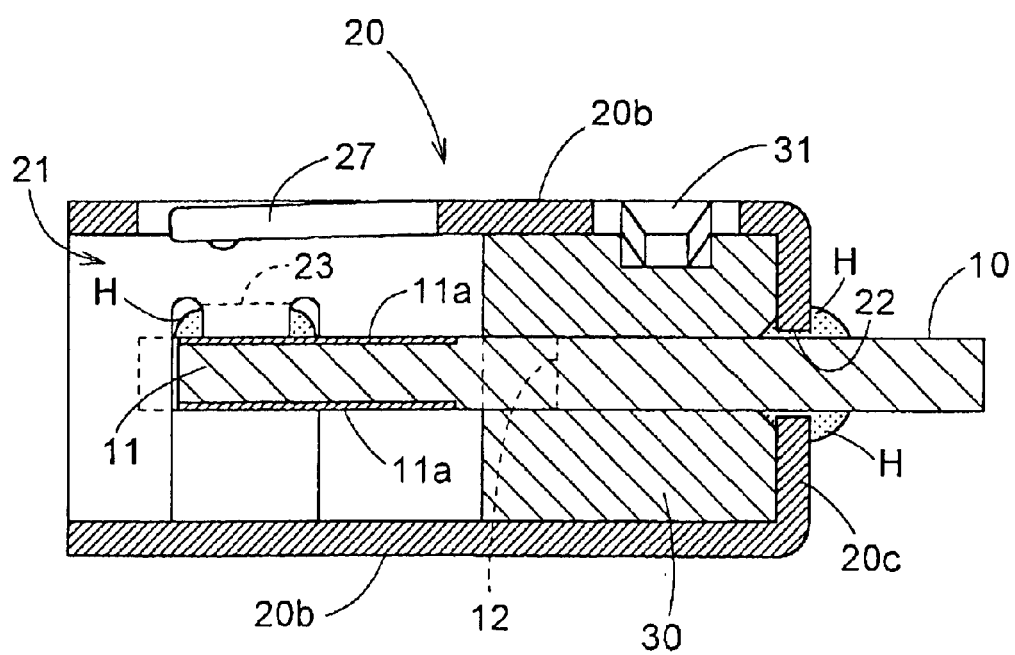
FIG. 3 is a horizontal section of the connector shown in FIG. 1.
Figure 4:
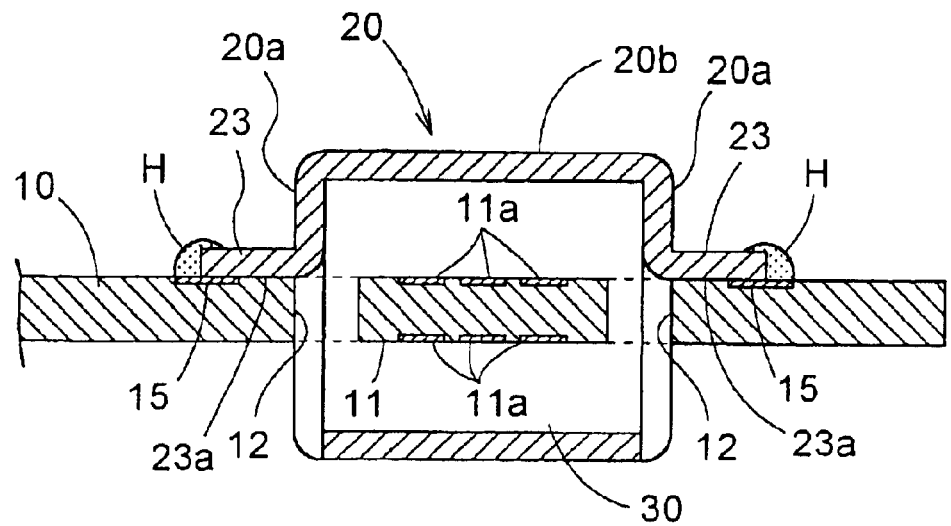
FIG. 4 is a vertical section of the connector shown in FIG. 1.
Figure 5:
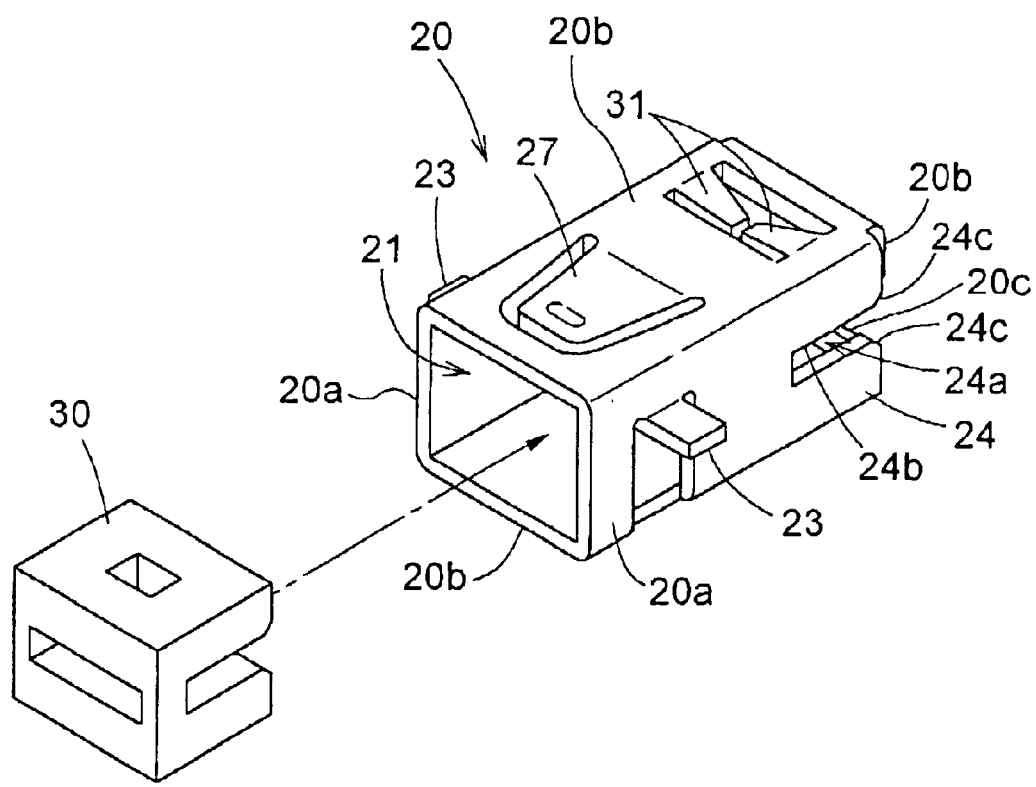
FIG. 5 is a perspective view illustrating insertion of a spacer into a housing of the connector.

FIG. 1 is an exploded perspective view of the connector, FIG. 2 is a plan view of the connector shown in FIG. 1, FIG. 3 is a horizontal section of the connector shown in FIG. 1, FIG. 4 is a vertical section of the connector shown in FIG. 1, FIG. 5 is a view of a spacer provided in the connector, and FIGS. 6–15 show variations of the connector according to this embodiment, respectively.

The connector 1 shown in FIGS. 1–5 and relating to the present invention, as shown in FIG. 1A in particular, includes a housing 20 which defines, at a base end thereof, a connecting opening 21 for connection to a jack or a plug as an unillustrated mating connector. This housing 20 is attachable to an edge of a printed circuit board (to be referred to as "circuit board" hereinafter) 10 in such a manner as to enclose a board segment 11 formed at the edge of the circuit board 10. And, as shown in FIG. 1B in particular, on the upper face and the lower face respectively of the board segment 11 of the circuit board 10, there are formed terminal lands 11a, so that terminals of the mating connector to be inserted through the connecting opening 21 will directly contact these terminal lands 11a for establishing electrical connection. In this way, this connector 1 is constructed such that the terminals of the mating connector will directly contact the terminal lands 11a of the board segment 11. Therefore, this connector 1 can omit such additional components as a contact for relaying between the mating connector and the terminal lands 11a or a base member for retaining the relayed connection. As a result, cost reduction as well as size reduction can be easily achieved.

The housing 20 is constructed in the form of an angular tube formed of a pair of right and left side walls 20a and upper and lower horizontal walls 20b interconnecting the side walls 20a. One open end of the housing 20 is used as the connecting opening 21 described above and the other opposite open end thereof is partially closed by a bottom wall 20c which defines an insertion opening 22 for the board segment 11.

The board segment 11 is a tongue-like portion formed between a pair of parallel grooves 12 cut away from an edge of the circuit board 10 in a direction normal thereto.

A width (a1) of the housing 20 measured between the outer surfaces of the opposed side walls 20a of the housing 20, i.e. measured in the direction along the edge of the circuit board 10 is substantially equal to a distance (a2) between the outer surfaces of the two grooves 12 of the circuit board 10. Hence, the right and left side walls 20a of the housing 20 are to be inserted into the respective grooves 12 of the circuit board 10. In this, as the right and left side walls 20a of the housing 20 come into abutment against the outer surfaces of the respective grooves 12, the housing is fixed in position in the right and left direction.

The housing 20 is manufactured by bending a meal plate. In the upper horizontal wall 20b of the housing 20, a pressing piece 27 is formed by cutting in and bending the corresponding portion of the metal plate. This pressing piece 27 is used for pressing and fixing the jack or plug of the mating connector inserted from the connecting opening 21.

Further, in each of the right and left side walls 20a of the housing 20, a fixing piece 23 is formed also by cutting in and bending or 90 degrees raising of the corresponding portion of the metal plate. The bottom side of this 90 degrees bent fixing piece 23 provides a horizontal attaching face 23a for attachment to the circuit board 10. These fixing pieces 23 are to be placed on a pair of solder attaching lands 15 formed on the surface of the circuit board 10 on the side opposite to the board segment 11 formed by the respective grooves 12 and these fixing pieces 23 are to be solder-fixed to the respective solder attaching lands 15. By employing this solder-fixing arrangement, at the border between the fixing piece 23 and the solder attaching land 15, there is formed a soldering portion (H) which requires only a relatively small space in the height direction (see FIG. 3).

Each fixing piece 23 is provided in the form of a wing-shaped piece formed by bending a portion of the side wall 20a formed of the metal plate. Hence, as this piece 23 is formed integrally with the side wall 20a, no attachment element is needed for connecting the fixing piece 23 to the side wall 20a. This is advantageous in forming the entire connector thin.

Further, with this fixing piece 23 formed integrally with the side wall 20a, i.e. with the housing 20, there occurs no attachment failure to the housing 20. Moreover, as this fixing piece 23 is fixed to the solder attaching land 15 of the circuit board 10 by means of soldering, it is possible to ensure sufficient strength for effectively withstanding a force applied to the connector in association with insertion or removal of the mating connector relative thereto.

The insertion opening 22 defined in the bottom wall 20c of the housing 20 as described above is formed as a slit which extends horizontally at the center of the bottom wall 20c. Continuously with this opening or slit 22, there are formed slits 24a in both side walls 20a of the housing 20. These slits 24a are used for forming binding portions 24 capable of vertically binding the circuit board 10. In use, as upper and lower face portions 24b of the slits 24a come into contact respectively with front and back faces of the circuit board 10, the housing 20 may be firmly retained to the circuit board 10. Further, open ends of these upper and lower face portions 24b on the side of the bottom wall 20c are chamfered to provide chamfered portions 24c having increased width for guiding smooth insertion to the circuit board 10. Further, the depth of this slit 24a is set so that when the bottom of the slit 24a contacts the bottom of the groove 12 of the circuit board 10, the attaching face 23a of the fixing piece 23 of the housing 20 will be overlapped with the solder attaching land 15. Accordingly, in attaching the housing 20 to the circuit board 10, the housing 20 will be inserted to the board segment 11 and pressed further until the bottom of the slit 24a of the binding portion 24 comes into abutment against the bottom of the groove 12, whereby an appropriate attachment position is realized.

Incidentally, the bottom wall 20c of the housing 20, as may be apparent from FIG. 3 in particular, is formed by bending the metal plate by 90 degrees so as to bring the upper and lower horizontal walls 20b into opposition to each other, with a gap formed between the leading end faces thereof providing the insertion opening 22.

Also, as the binding portion 24 is formed by the metal side wall 20a per se, this portion has high strength. Hence, even if the housing 20 is formed with a low profile, the binding portion 24 will still be able to effectively withstand an inadvertent force which may be generated due to distortion in association with insertion or withdrawal of the mating connector. Moreover, as the front and back faces of the circuit board 10 are bound by the narrow elongate faces of the parallel face portions 24b disposed upwardly and downwardly of the slit 24a of the binding portion 24, such force applied between the housing 20 and the circuit board 10 may be distributed over these face portions 24b. This significantly reduces the possibility of breakage or the like of the circuit board 10 due to local stress concentration.

In the inner space of the housing 20 adjacent the bottom wall 20c and in the space formed between the horizontal wall 20b and the board segment 11, there is disposed a spacer 30 as shown in FIG. 5. This spacer 30 is made of a dielectric material such as mold resin or phenol resin and is disposed with being elastically urged toward the board segment 11 by means of a spacer pressing element 31 which is formed by cutting in the horizontal wall 20b. The spacer 30 fills the gap between the housing 20 and the board segment 11, thereby to reliably eliminate vertical looseness in the housing 20 relative to the circuit board 10. This spacer 30 acts also as a "partitioning wall" between the connecting opening 21 of the housing 20 and the circuit board 10, thereby preventing intrusion of a foreign object onto the circuit board 10 via the connector 1.

Figure 6:
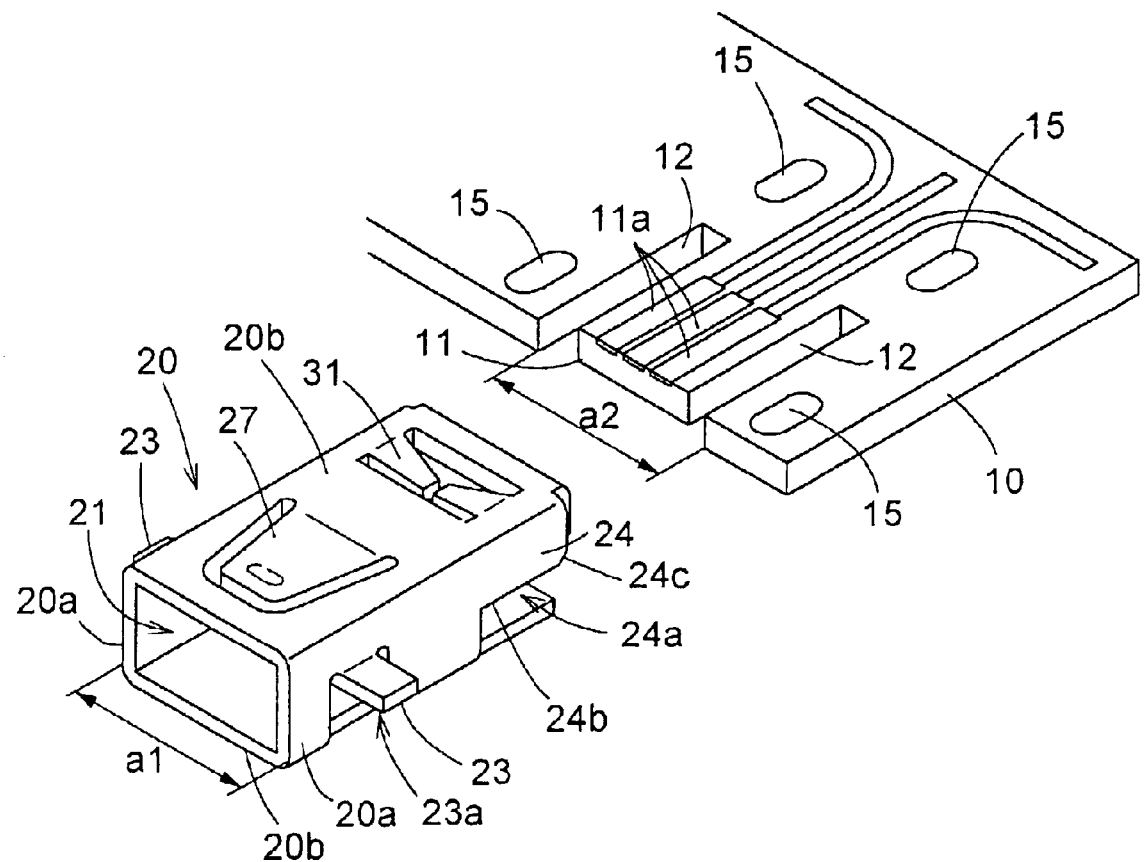
FIG. 6 is a perspective view showing a variation of the connector according to the first embodiment.
Figure 7:
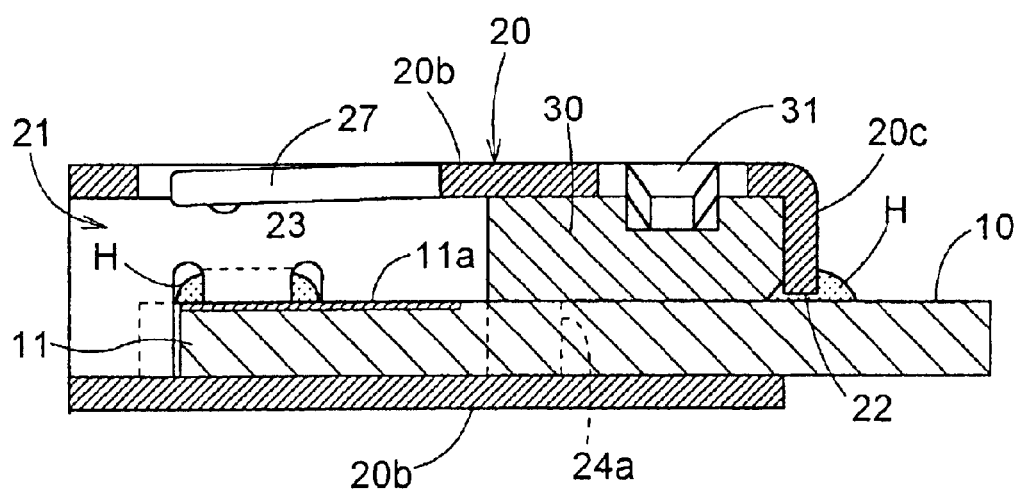
FIG. 7 is a horizontal section of the connector shown in FIG. 6.
Figure 8:
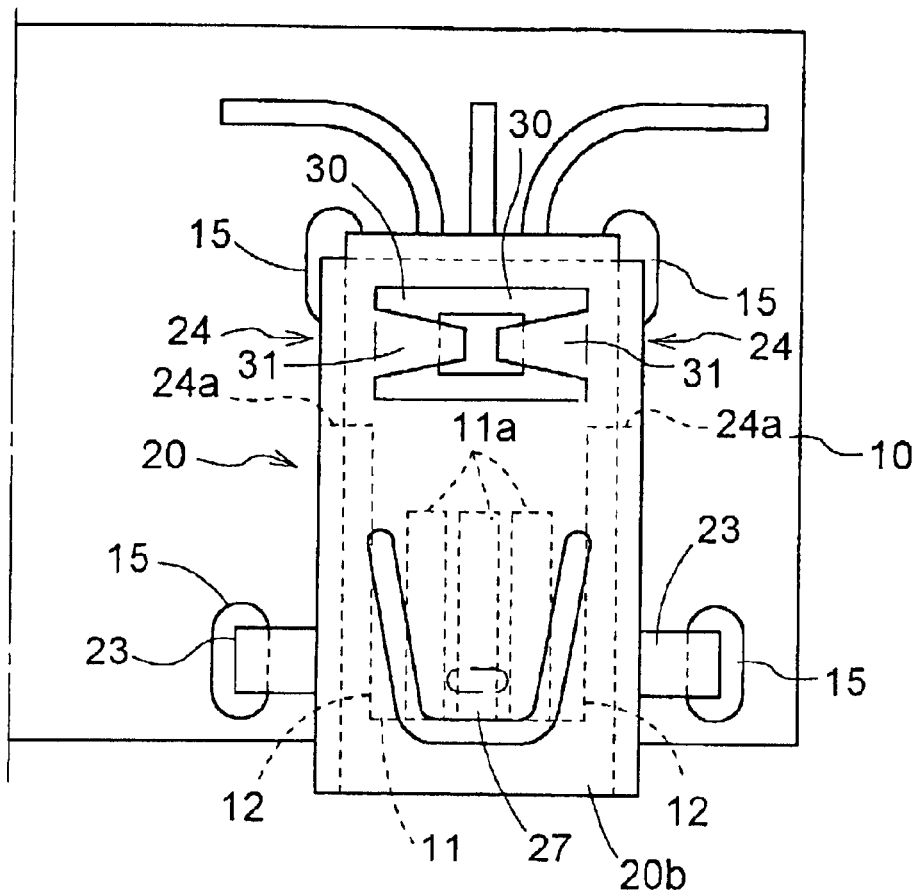
FIG. 8 is a plan view of the connector shown in FIG. 6.
Figure 9:
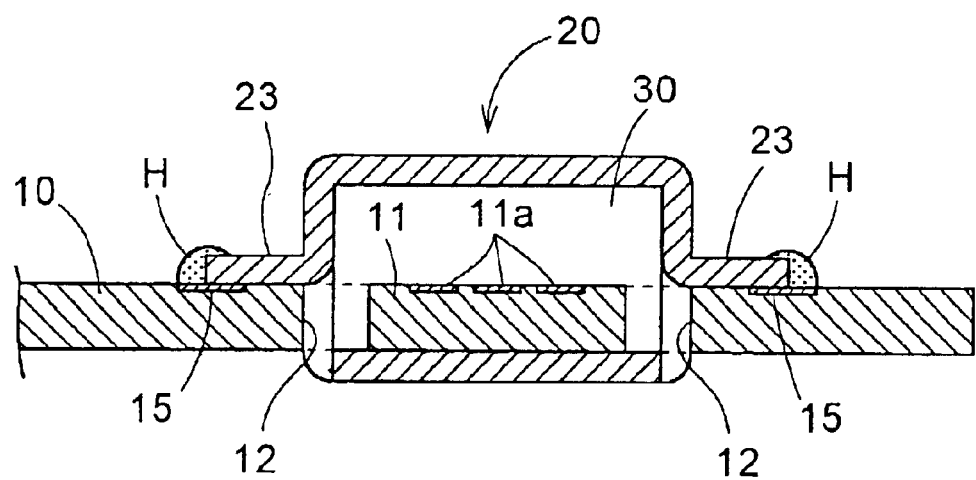
FIG. 9 is a vertical section of the connector shown in FIG. 6.

Next, a variation of the connector 1 shown in FIG. 1 will be described with reference to FIGS. 6–9. FIG. 6 is an exploded perspective view of the connector, FIG. 7 is a horizontal section of the connector shown in FIG. 6, FIG. 8 is a plan view of the connector shown in FIG. 6 and FIG. 9 is a vertical section of the connector shown in FIG. 6.

In this variation, the housing 20 of the connector 1 shown in FIG. 1 is further reduced in thickness.

Specifically, the inner surface of the lower horizontal wall 20b constituting the housing 20 is placed in contact with the back side of the board segment 11, the projecting height of the housing 20 downwardly from the circuit board 10 substantially corresponds only to the thickness of the horizontal wall 20b.

In the case of this construction, the entire width of the lower horizontal wall 20b functions as a lower face portion of the slit 24a forming the binding portion 24. Therefore, the binding portion 24 provides even higher strength against the inadvertent force generated due to distortion during insertion or removal of the mating connector.

In this variation too, as shown in FIG. 7, the spacer 30 is provided inside the housing 20.

With the connectors 1 described above, the fixing pieces 23 are provided one for each of the right and left side walls 20a of the housing 20. Alternatively, a plurality of such fixing pieces 23 may be provided for each of the right and left side walls 20a of the housing 20. Further, if the housing 20 can be fixed to the circuit board 10 sufficiently only by providing such plurality of fixing pieces 23 as described above, then, the binding portions 24 and/or the spacer 30 may be omitted. Also, if needed, the face portion 24b of the binding portion 24 may be fixed by means of soldering to the board segment 11 engaged into the slit 24a.

Moreover, it is also within the scope of the present invention to form the slit 24a of the binding portion 24 with tapering such that as the board segment 11 is inserted into the slit 24a, the vertical gap therebetween becomes narrower. By forming the slit 24a with such tapering, at the initial stage in inserting the board segment 11 into the binding portions 24, this insertion of the board segment 11 is facilitated by the greater vertical width of the slits 24a relative to the board segment 11. Also, as the board segment 11 is further inserted into the slits 24a, the vertical widths of the slits 24a become narrower, so that when the attachment of the housing 20 to the circuit board 11 is completed, the face portions 24b of the slits 24a will "bite into" the circuit board 10, thereby reinforcing the fixation between the housing 20 and the circuit board 10.

Figure 10:
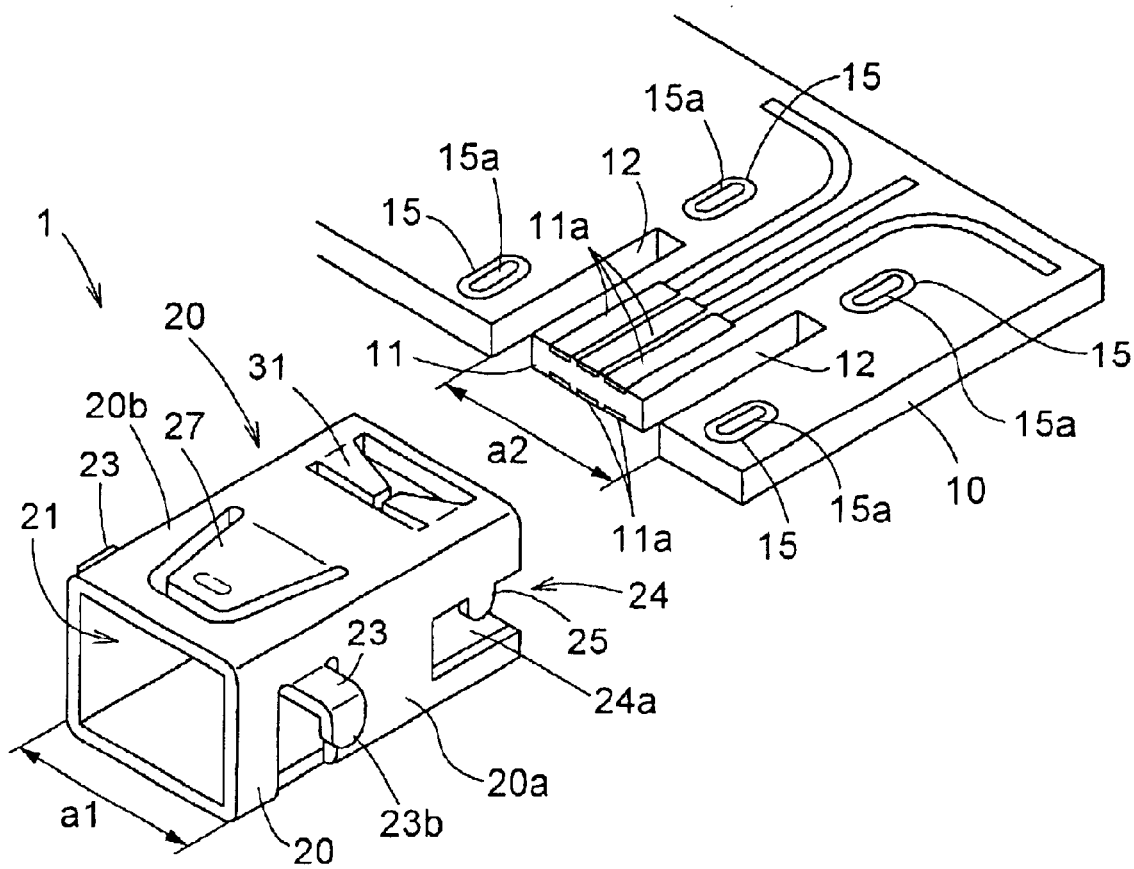
FIG. 10 is a perspective view showing another variation of the connector according to the first embodiment.
Figure 11:
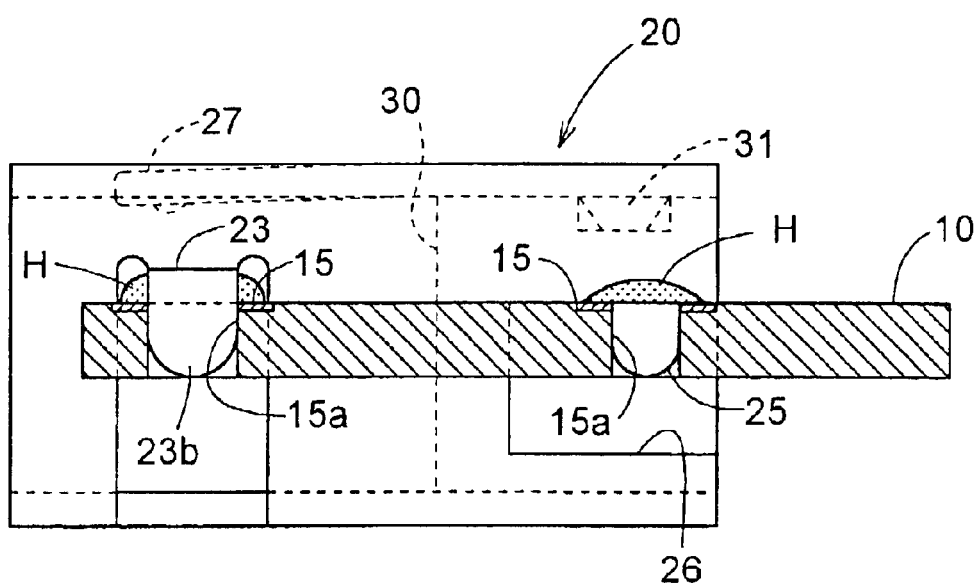
FIG. 11 is a horizontal view of the connector shown in FIG. 10.
Figure 12:
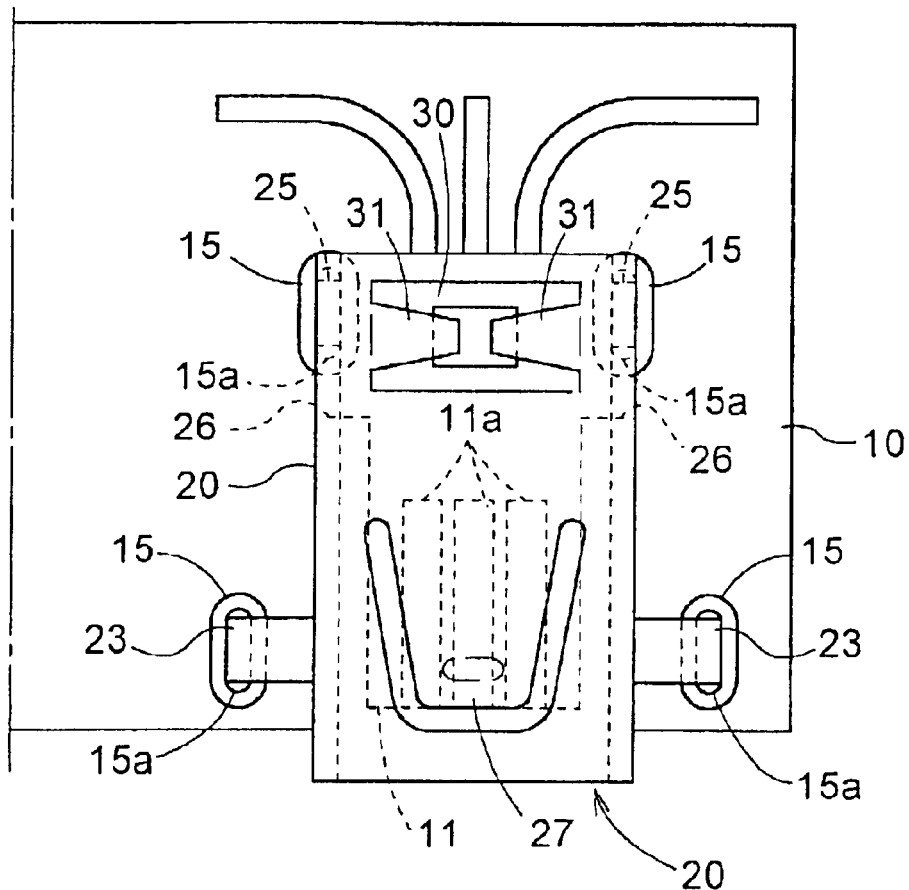
FIG. 12 is a plan view of the connector shown in FIG. 10.
Figure 13:
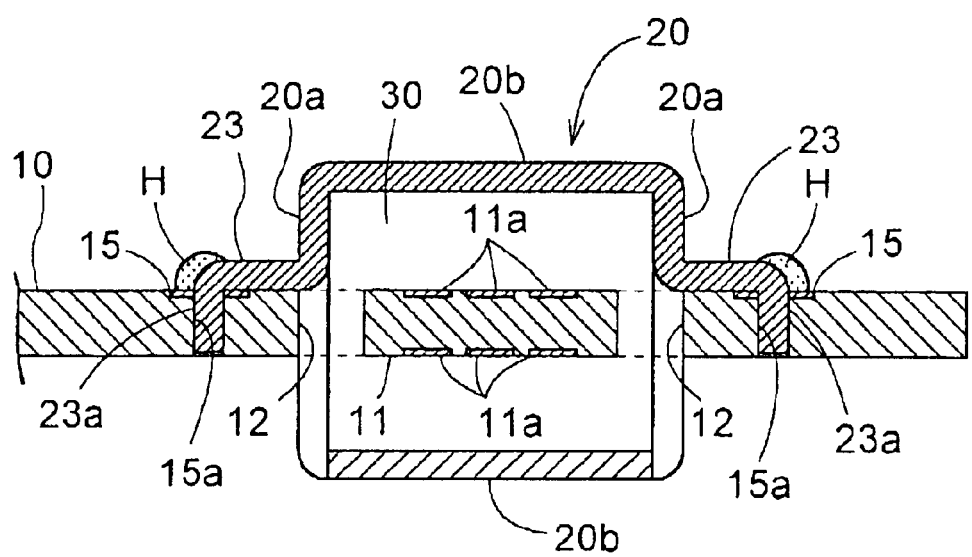
FIG. 13 is a vertical section of the connector shown in FIG. 10.

Next, another variation of the connector 1 according to the first embodiment will be described with reference to FIGS. 10–13. In these figures, FIG. 10 is an exploded perspective view of the connector, FIG. 11 is a horizontal section of the connector shown in FIG. 10, FIG. 12 is a plan view of the connector shown in FIG. 10 and FIG. 13 is a vertical section of the connector shown in FIG. 10, respectively.

In this variation shown in FIGS. 10–13, like the foregoing connectors, at one terminal end of the housing 20, there is formed the connecting opening 21 for the jack or plug of the unillustrated mating connector. This housing 20 is attached to an edge of the circuit board 10 in such a manner as to enclose the board segment 11 formed at the edge of the circuit board 10. On the upper and lower sides of the board segment 11, there are formed the terminal lands 11a respectively. As the terminals of the mating connector inserted through the connecting opening 21 come into direct contact with the terminal lands 11, required electrical connection is established.

The method of forming the board segment 11 used in this variation is same as described hereinbefore and will not be described again here. Also, like numerals are used for denoting like members or elements providing the same functions as described previously.

On the right and left side walls of the housing 20, there are provided a pair of right and left fixing pieces 23 which are to be placed on and solder-fixed to a pair of solder attaching lands 15 formed adjacent the opposed grooves 12 of the circuit board 10. At the leading end of each fixing piece 23 used in this variation, there is formed, by bending the end perpendicularly, a rib 23a which is to be inserted into an associated hole 15a formed in the solder attaching land 15.

Further, in the case of this variation also, a binding portion 24 formed in each of the right and left side walls 20a of the housing 20 is formed by the slit 24a. In this variation, however, at the upper face portion 24b of the slit 24a, there is formed a rib 25 which is to be inserted into a hole 16a formed in the solder attaching land 15 provided on the circuit board 10. After this rib 25 is inserted into the hole 16a, the upper face portion 24b of the slit 24a will be soldered to the solder attaching land 15.

As the rib 25 of this fixing piece 23 has a length shorter than the thickness of the circuit board 10, it will not hinder desired reduction of the thickness of the housing 20.

Still another variation of the connector 1 according to the first embodiment will be described with reference to FIGS. 14–15.

Figure 14:
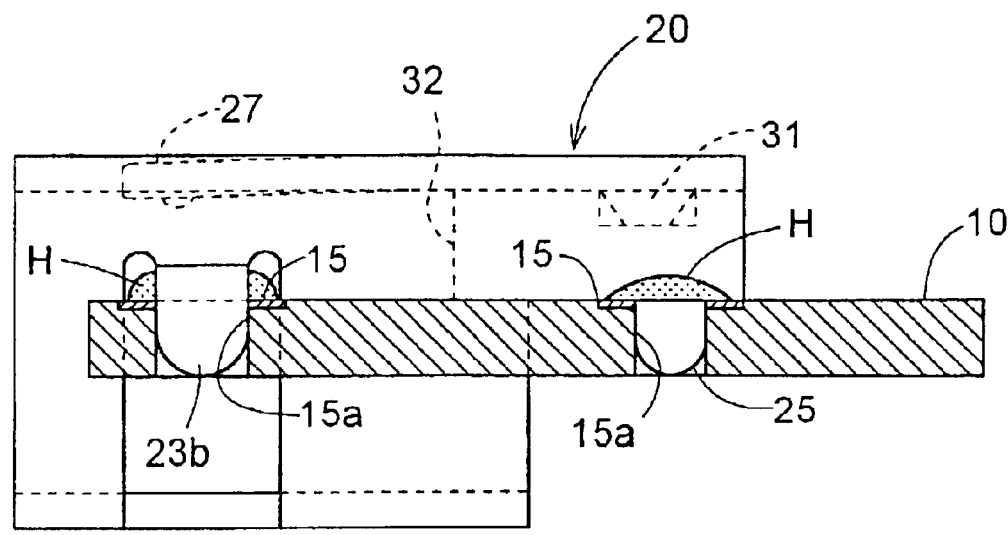
FIG. 14 is a perspective view showing still another variation of the connector according to the first embodiment.
Figure 15:
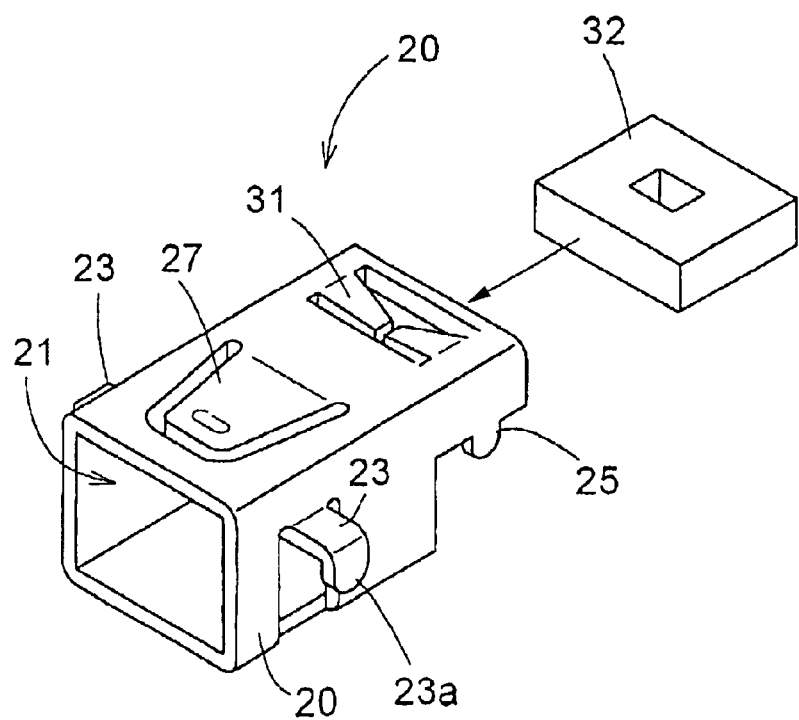
FIG. 15 is a perspective view showing a spacer to be inserted into the connector shown in FIG. 14.
Figure 16:
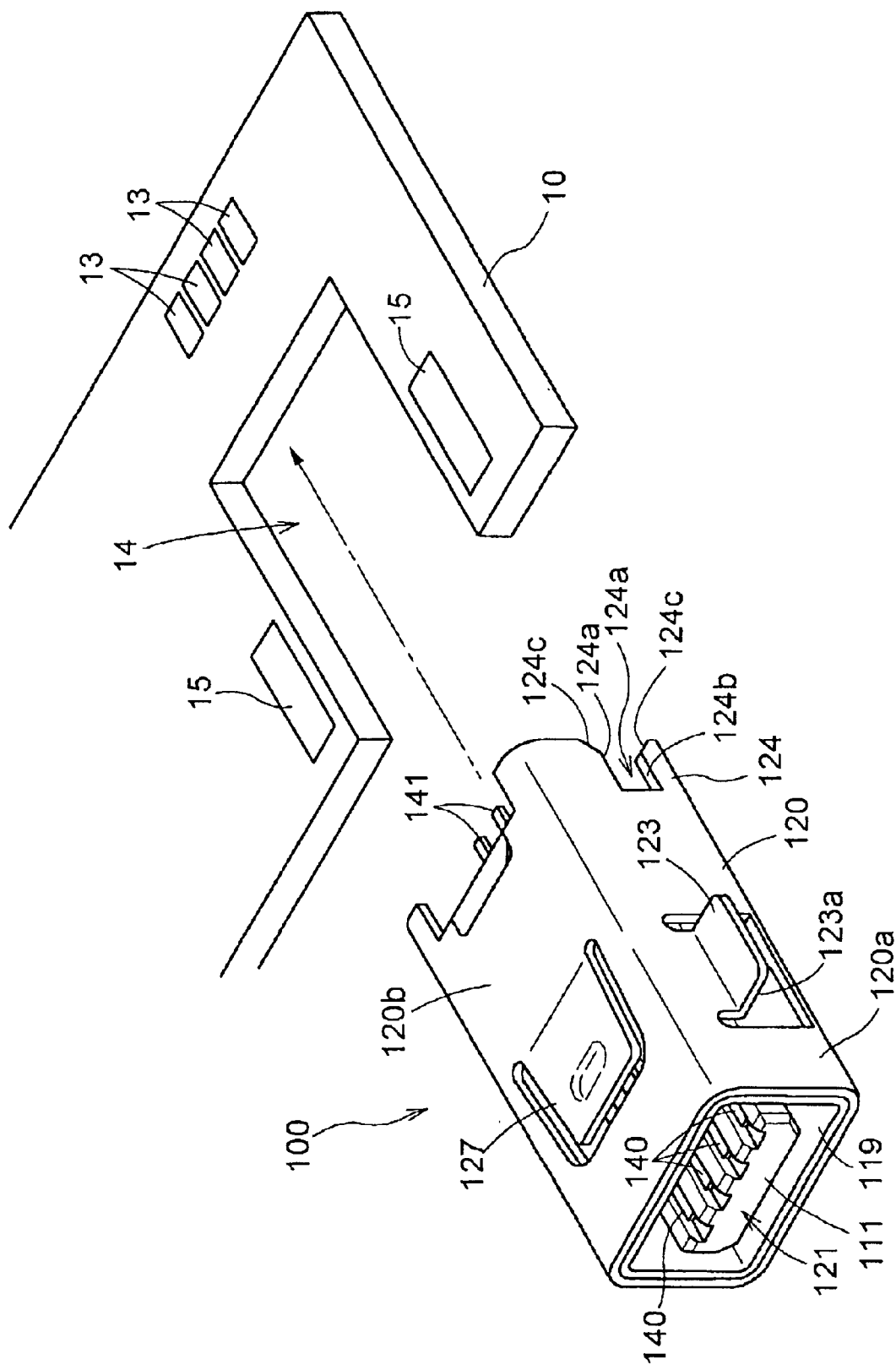
FIG. 16 is a perspective view showing a second embodiment of a connector relating to the present invention.
Figure 17:
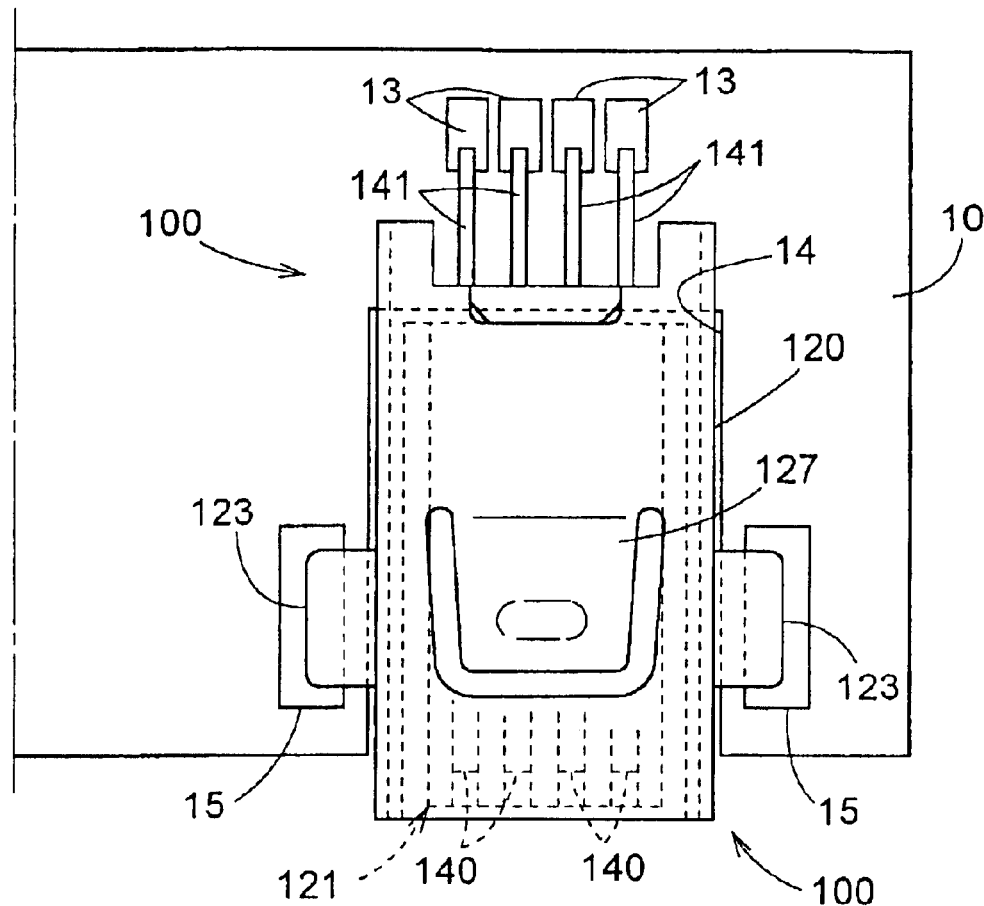
FIG. 17 is a plan view of the connector shown in FIG. 16.
Figure 18:
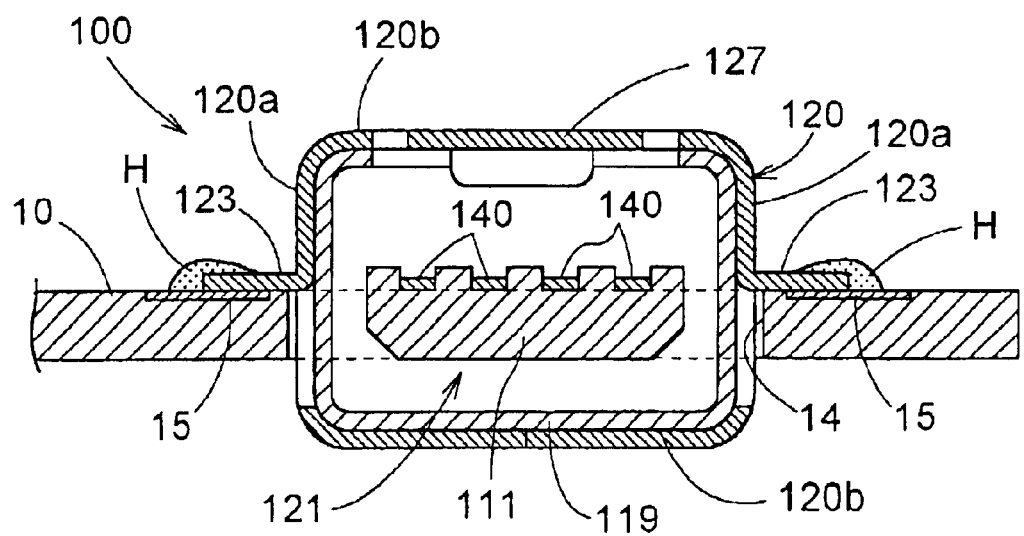
FIG. 18 is a vertical section of the connector shown in FIG. 16.
Figure 19:
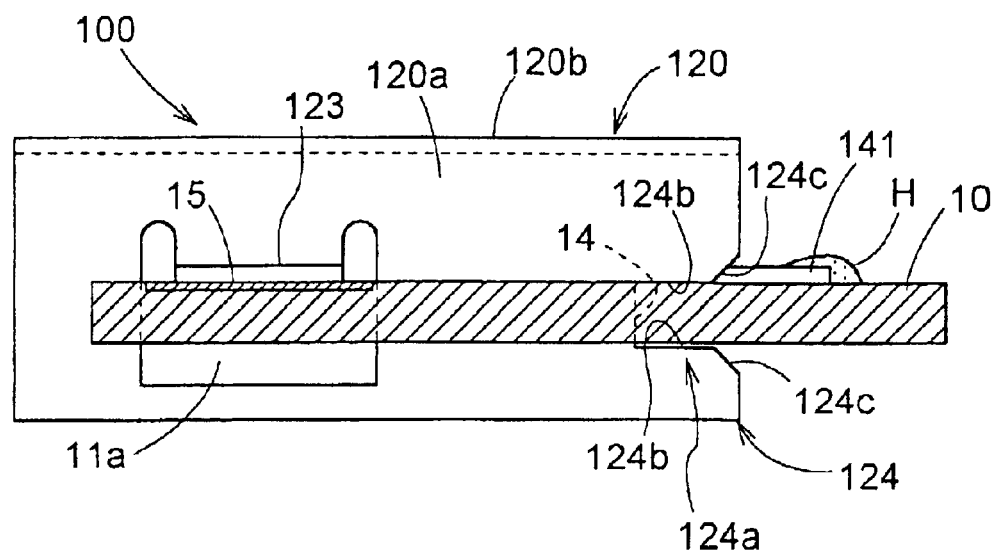
FIG. 19 is a side view of the connector shown in FIG. 16.
Figure 20:
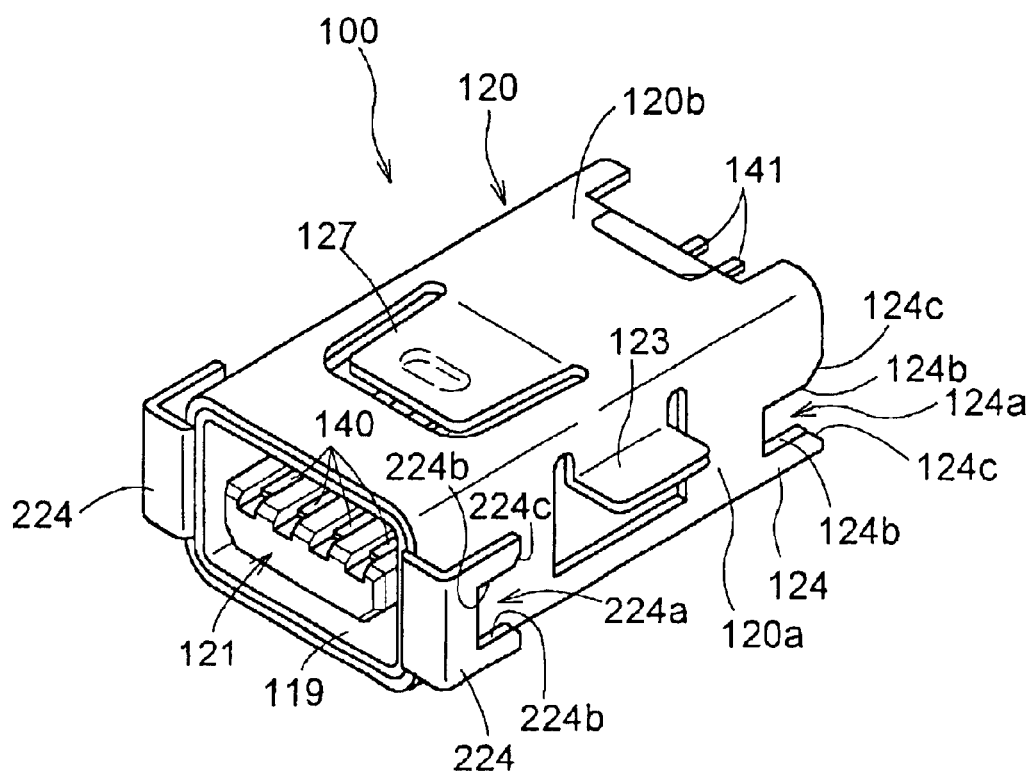
FIG. 20 is a perspective view showing a variation of the connector according to the second embodiment.
Figure 21:
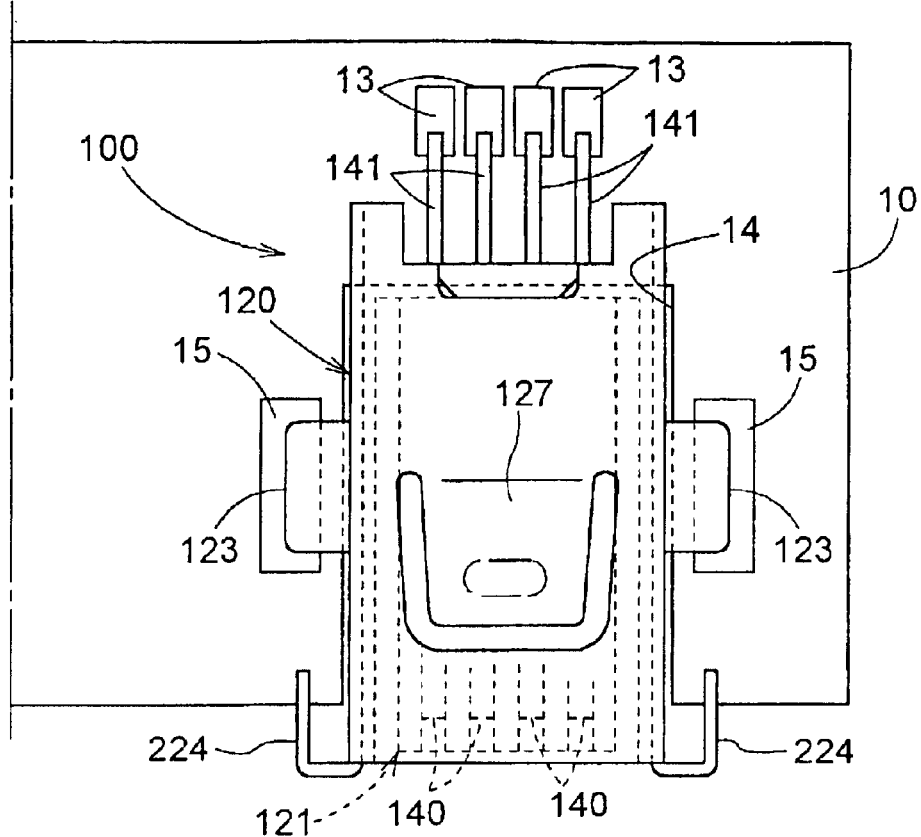
FIG. 21 is a plan view of the connector shown in FIG. 20.
Figure 22:
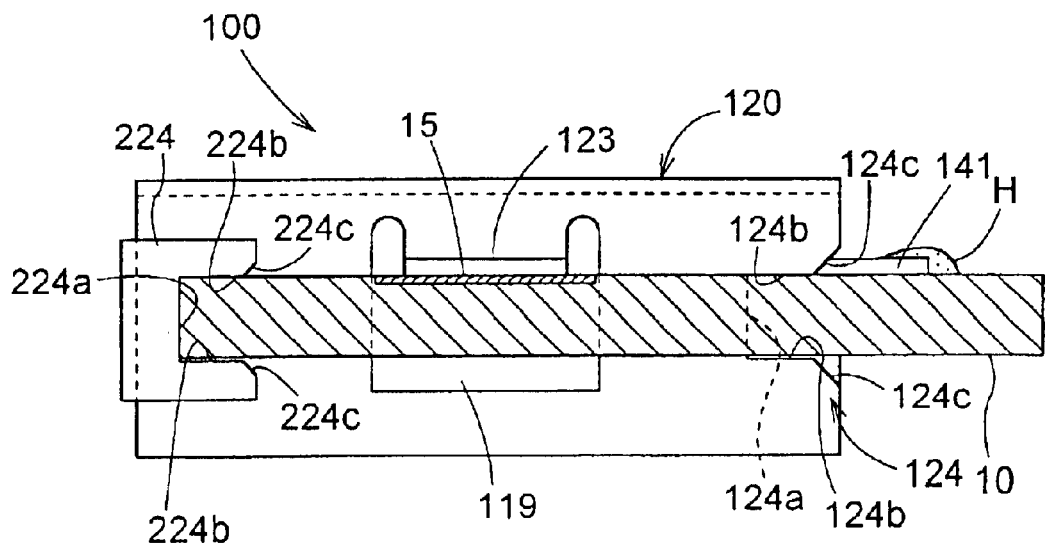
FIG. 22 is a side view of the connector shown in FIG. 20.

In the case of this further variation, as shown in FIG. 14, the lower face portion of the slit 24a which is used for forming the binding portion 24 in the foregoing constructions is cut off. Accordingly, this housing 20 encloses only the board segment 11 completely. In the case of this housing 20, a spacer 32 to be provided therein is configured so as to close the space between the circuit board 10 and the upper horizontal wall 20b of the housing 20, as shown also in FIG. 15.

In the case of the foregoing embodiment and variations, the board segment 11 is provided as the narrow elongate portion formed between the two grooves 12 defined in the edge of the circuit board 10. Instead, with omitting the grooves 12, the board segment 11 may be formed as a projecting portion which projects outward from the edge of the circuit board 10.

Next, a second embodiment of a printed circuit board mounted electrical connector relating to the present invention will be described with reference to FIGS. 16 through 19.

A connector 100 according to this embodiment is constructed a jack to and from which a plug as an unillustrated mating connector is inserted and removed. This connector 100 includes a terminal base 111 mounting on its upper face contact elements 140 as contacts for the mating plug and a housing provided in the form of an angular tube and enclosing this terminal base 111. The housing consists essentially of a metal outer housing 120 and a resin inner housing 119 engaged within the outer housing 120. The terminal base 111 may be connected and supported to the inner housing 119 via a bracket not shown or may also be formed integrally with this inner housing 119. At one open end of the housing, the inner housing 119 and the terminal base 111 together form a connecting opening 121 as a jack for the mating connector. The other open end opposite to the connecting opening 121 of the housing is provided as a board connecting opening, from which board connecting terminals 141 project. The board connecting terminals 141 and the contact elements 140 are electrically connected with each other. In use, this connector 100 will be inserted into a rectangular cutout 14 formed in the circuit board 10 and the board connecting terminals 141 will be soldered to terminal attaching lands 13 formed on the upper side of the circuit board 10, whereby this connector 100 functions as a connector mounted on the printed circuit board 10. In this assembled condition, at the connecting portions between the board connecting terminals 141 and the terminal attaching lands 13, there are formed low-profile soldering portions H which require only relatively small space in the height direction.

The metal outer housing 120 is a tubular component formed by bending a metal plate and consists of right and left side walls 120a and upper and lower horizontal walls 120b interconnecting the side walls 120a. The inner housing 120 made of resin is also a tubular component of a substantially similar shape to the outer housing 120. The inner housing 119 is sized to be snugly fitted within the interior of the outer housing 120.

On the upper face of the outer housing 120, there is formed, by cutting, a pressing piece 127 for restricting looseness in the tube axis direction of the inner housing 119 relative to the outer housing 120.

On the opposed right and left side walls 120a of the outer housing 120, there are provided a pair of right and left fixing pieces 123 which are to be placed on and solder-fixed to a pair of solder attaching lands 15 formed adjacent opposed lateral faces of the cutout 14 of the circuit board 10. Hence, at the borders between the fixing pieces 123 and the solder attaching lands 15, there are formed low-profile soldering portions H which require only relatively small space in the height direction.

Each fixing piece 123 is formed by bending by 90 degrees a tongue portion formed by cutting in a portion of the side wall 120a of the outer housing 120. The lower face of this bent portion functions as an attaching face 123a for the circuit board 10. As this fixing piece 123 is formed integrally with the outer housing 120, any high-profile member or element requiring relatively large space in the height direction, such as a bracket or a bolt, will not be needed for connecting the fixing piece 123 to the outer housing 120. Accordingly, the fixing piece 123 does not hinder desired thickness reduction of the connector 100.

Further, there exists no looseness between the fixing piece 123 and the outer housing 120, since the former is formed integrally with the latter. Moreover, since the fixing piece 123 is solder-fixed to the solder attaching land 15 of the circuit board 10, the outer housing 120 may be securely fixed at a predetermined position on the circuit board 10.

Also, at the board-side ends of the right and left side walls 120a of the outer housing 120, there are formed binding portions 124 for binding the front and back sides of the circuit board 10. Each binding portion 124 is formed by a slit 124a which extends from the board-side end of the right or left side wall 120a along the tube axis direction. In use, when this connector 100 is inserted into the cutout 14 of the circuit board 10, the connector 100 will be pushed in until the edge of the board 10 comes into contact with the bottom face of the slit 124a. As this binding portion 124 too is formed integrally with the metal outer housing 120, this binding portion 124 has higher strength than a binding portion which could be formed instead in the inner housing 119 made of resin, so that the portion can effectively withstand the inadvertent force generated due to distortion during insertion or removal of the mating connector.

Further, the slit 124a of the binding portion 124 is configured so as to bind the front and back sides of the circuit board 10 with parallel narrow elongate face portions 124b formed on the opposed sides thereof. For this reason, as this binding portion 124 contacts the circuit board 10 through the narrow and elongate faces 124b thereof, the force applied between the outer housing 120 and the circuit board 10 may be distributed over these entire faces, whereby damage or breakage due to local stress concentration at a particular portion of the circuit board 10 may be avoided advantageously. Moreover, such trouble as removal or peel-off of the soldering portions H between the board connecting terminals 31 and the terminal attaching lands 13 due to looseness between the connector 100 and the circuit board 10 may be avoided also.

Also, at the upper and lower face portions 124b in the opening entrance region of the slit 124a, there are formed chamfered portions 143c for facilitating the insertion of the circuit board 10 into this slit 124a.

Next, another variation of the connector 100 according to the second embodiment will be described with reference to FIGS. 20 through 23.

In this variation, further binding portions 224 are added to the connector 100 shown in FIGS. 16 through 19. These further binding portions 224 are provided at the ends of the right and left side walls 120*a* of the outer housing 120 on the side of the connecting opening 121. Like the binding portions 124, these further binding portions 224 also bind the front and back sides of the circuit board 10. Each binding portion 224 is formed by bending outward an extension of the side wall 120*a* of the outer housing 120. And, a free end of this portion 224 extends parallel to the tube axis and at this free end, there is formed a slit 224*a* into which the edge of the circuit board 10 engages when the connector 100 is inserted into the cutout 14. As this further binding portion 224 too is formed integrally with the outer housing 120, it has high strength against the inadvertent force.

The slit 224*a* of this binding portion 224 also is configured so as to bind the front and back sides of the circuit board 10 with narrow elongate face portions 224*b* which are formed parallel with each other on the opposed sides thereof. And, at the opening entrance region of the slit 224*a*, chamfered portions 224*c* are formed for facilitating the insertion of the circuit board 10 into the slit 224*a*.

Figure 23:
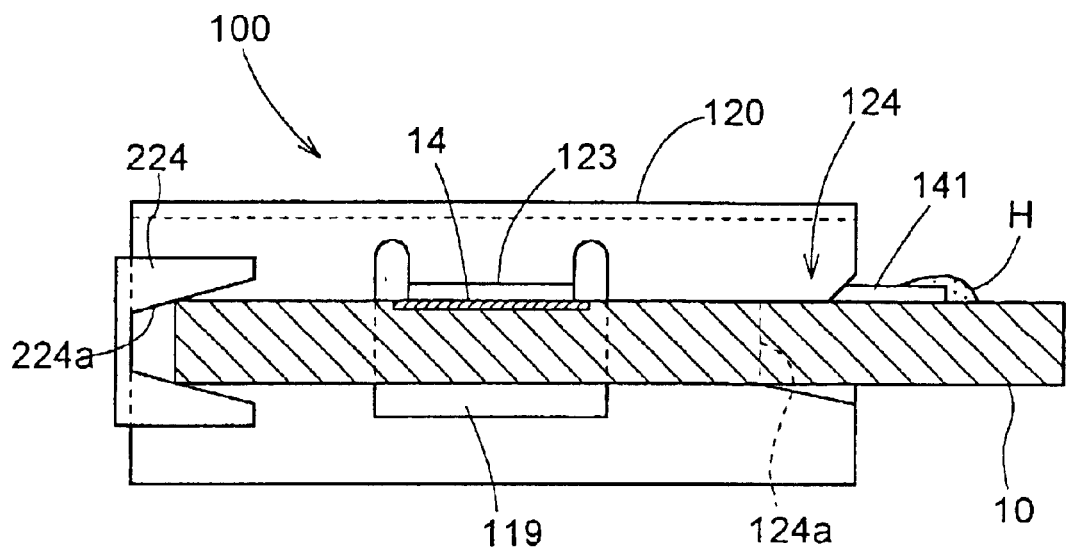
FIG. 23 is a side view showing an improved variation of the connector shown in FIG. 20.

Incidentally, the slits 124*a*, 224*a* of these binding portions 124, 224 may be formed with tapering as shown in FIG. 23 such that the deeper the slit, the wider it becomes. With such tapered slits 124*a*, 224*a*, at the initial stage in inserting the circuit board 10 to the binding portions 124, 224, the greater widths of the slits 124*a*, 224*a* for receiving the circuit board 10 facilitate this insertion of the circuit board 10. Then, as the circuit board 10 is further inserted into the binding portions 124, 224, the receiving widths of the slits 124*a*, 224*a* for the circuit board 10 become narrower. And, when the attachment of the outer housing 120 to the circuit board 10 is completed, the binding portions 124, 224 bite into the circuit board 10, thereby to reinforce the fixed retention of the outer housing 120 to the circuit board 10.

Incidentally, as described hereinbefore, in case the biding portions 124 and 224 are provided on the opposed ends of the right and left side walls 120*a* of the outer housing 120, it is preferred that the fixing pieces 123 be disposed at intermediate positions between these two pairs of binding portions 124, 224. With this arrangement, any inadvertent force generated between the connector 100 and the circuit board 10 may be distributed to the two binding portions 124, 224 and the fixing pieces 123.

Still another variation of the connector 100 according to the second embodiment will be described next with reference to FIG. 24.

In the case of this variation of connector 100, the binding portions 324 on the side of the circuit board are formed by bending outward the extensions of the right and left side walls 120*a* of the metal outer housing 120. And, a slit 324*a* formed at each bent portion is capable of laterally receiving and binding the edge portion of the circuit board 10 beside the cutout 14.

Still another variation of the connector 100 according to the second embodiment will be described next with reference to FIG. 25.

In the case of this variation of connector 100, the binding portions 424 on the side of the connecting opening 121 are formed by tongues formed by cutting and bending outward portions of the right and left side walls 120*a* of the metal outer housing 120. Each tongue defines a slit 424*a* for receiving the edge of the circuit board 10.

Figure 24:
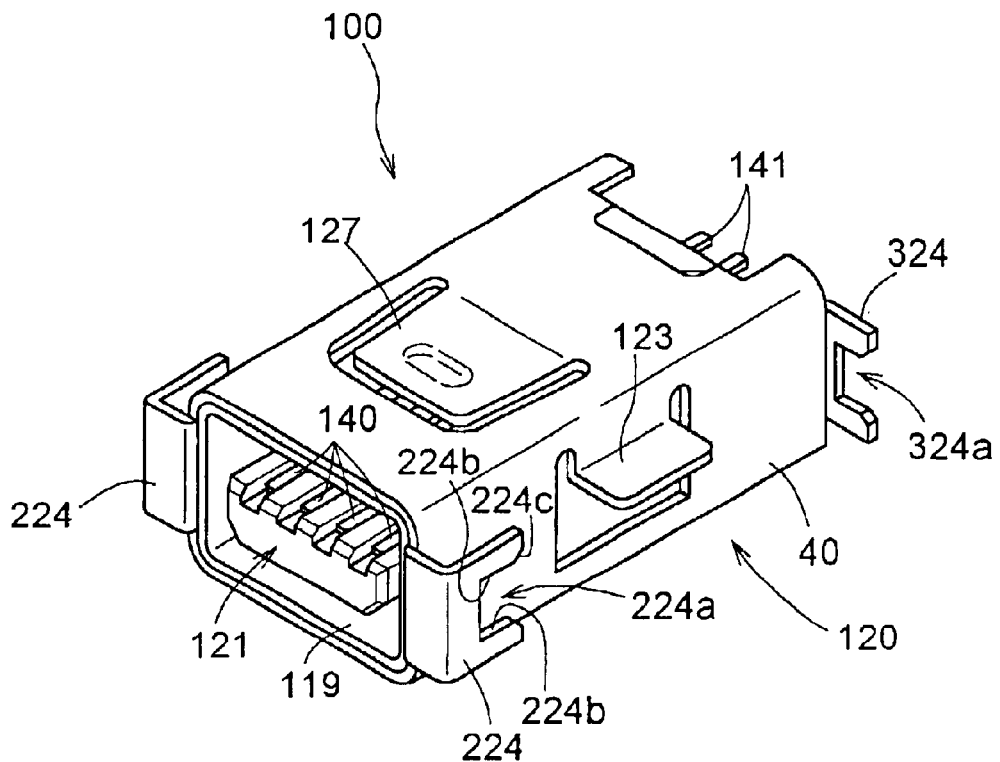
FIG. 24 is perspective view showing still another variation of the connector according to the second embodiment.
Figure 25:
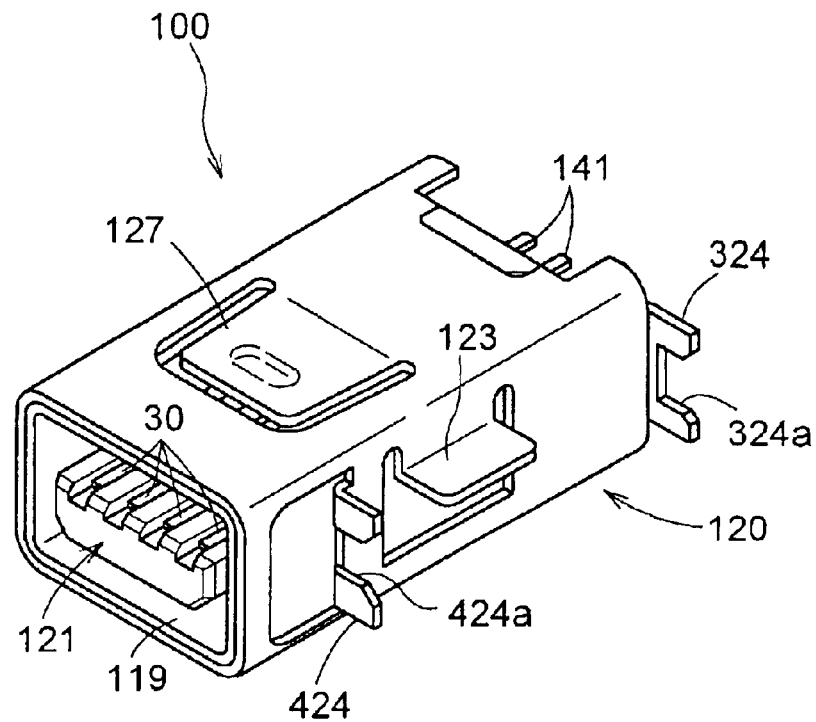
FIG. 25 is perspective view showing still another variation of the connector according to the second embodiment.
Figure 26:
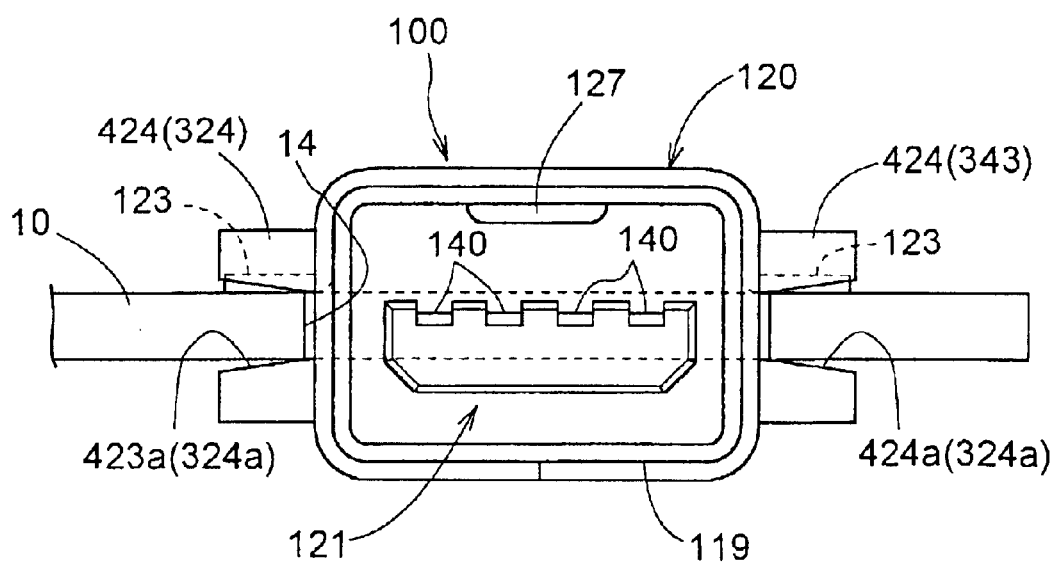
FIG. 26 is perspective view showing still another variation of the connector according to the second embodiment.

In the case also of the binding portions 324, 424 shown respectively in FIGS. 24 and 25, by forming their slits with tapering as shown in FIG. 26, it is possible to minimize lateral looseness of the connector 100 relative to the circuit board 10. Further, in order to further reinforce the fixation between the connector 100 and the circuit board 10, the slit forming faces of the binding portions 324, 424 and the front and/or back side of the circuit board 10 may be fixed by means of soldering.

The invention may be embodied in other ways than described above. The foregoing embodiments and their variations should therefore be understood as illustrative, not limiting, of the scope of the present invention defined in the appended claims. Various modifications will be apparent for those skilled in the art without departing from the essential spirit of the invention.

What is claimed is:

1. A printed circuit board mounted electrical connector comprising:
   a metal housing defining, at one end thereof, a connecting opening for receiving a mating connector, the housing including a pair of right and left side walls and at least one horizontal wall interconnecting the side walls;
   a board segment having a terminal land which is formed at a portion of a printed circuit board and which is capable of directly contacting said mating connector, the board segment being defined by a first groove and a second groove formed in the printed circuit board, said right and left side walls being fit into the first groove and the second groove, respectively, and the board segment being substantially enclosed by said side walls and said horizontal wall; and
   a fixing piece extending from said each side wall, the fixing piece having an attaching face which is to be placed on and solder-fixed to a solder attaching land formed on said circuit board.

2. A printed circuit board mounted electrical connector comprising:
   a metal housing forming, at an end thereof, a connecting opening for receiving a mating connector, the metal housing including a pair of right and left side walls and at least one horizontal wall interconnecting the side walls, said right and left side walls being fit into a first groove and a second groove, respectively, which are formed in the printed circuit board for defining a board segment, the board segment having a terminal land which is capable of directly contacting said mating connector, and said right and left side walls and said horizontal wall together substantially enclosing said board segment; and
   a fixing piece extending from said each side wall, the fixing piece having an attaching face which is to be placed on and solder-fixed to a solder attaching land formed on said circuit board.

3. The connector according to claim 2, wherein said each side wall includes at least one binding portion for binding front and back sides of the circuit board.

4. The connector according to claim 2, wherein said metal housing further includes, at the other end thereof, a bottom wall which wall defines an inserting opening for allowing insertion of said circuit segment.

5. The connector according to claim 2, wherein said metal housing is an angular tube formed of said opposed side walls and upper and lower horizontal walls, and a spacer is provided between said board segment inserted into said housing and said upper horizontal wall and between said board segment and said lower horizontal wall, respectively.

6. A printed circuit board mounted electrical connector comprising:

a metal housing forming, at one end thereof, a connecting opening for receiving a mating connector, said housing including a pair of right and left side walls and at least one horizontal wall interconnecting the side walls;

a board segment having a terminal land which is electrically connected with a wiring of a printed circuit board and which also is capable of directly contacting said mating connector, the board segment being defined by a first groove and a second groove formed in the printed circuit board, said right and left side walls being fit into the first groove and the second groove, respectively, and said board segment being substantially enclosed by said side walls and said horizontal wall;

a fixing piece extending from said each side wall, said fixing piece having an attaching face which is to be placed on and solder-fixed to a solder attaching land formed on said circuit board; and at least one binding portion provided in said each side wall, the binding portion being capable of binding front and back sides of said circuit board.

7. The connector according to claim 6, wherein said segment is a board segment formed as a portion of said printed circuit board.

8. The connector according to claim 6, wherein said segment is a terminal base supported by said metal housing.

9. A printed circuit board mounted electrical connector comprising:

a metal outer housing having a pair of right and left side walls and at least one horizontal wall interconnecting the side walls;

an inner housing accommodated and held within said outer housing;

a connecting opening formed at one end of said outer housing for receiving a mating connector;

a terminal base having a contact element capable of directly contacting said mating connector, the terminal base being enclosed and held within said inner housing;

at least one binding portion provided in said outer housing, the binding portion being capable of binding front and back sides of said circuit board; and a fixing piece extending from said each side wall, said fixing piece having an attaching face which is to be placed on and solder-fixed to a solder attaching land formed on said circuit board.

10. The connector according to claim 9, wherein said binding portion is provided in said each side wall of the outer housing on a side of said circuit board and/or on the opposite side to the circuit board.

11. The connector according to claim 9, wherein said outer housing is attached to a cutout defined in said circuit board such that said terminal base is disposed in substantially same level as the circuit board.

12. The connector according to claim 9, wherein said binding portion has a first contact face for contacting the front side of the circuit board and a second contact face for contacting the back side of the circuit board.

13. The connector according to claim 12, wherein said first contact face and said second contact face define a gap therebetween which becomes narrower in a direction away from the circuit board.

14. The connector according to claim 12, wherein at least one of said first and second contact faces is chamfered at another end thereof.

15. The connector according to claim 9, wherein said binding portion is formed directly on an end of said each side wall.

16. The connector according to claim 9, wherein said binding portion is formed on an outer extension of said each side wall.

* * * * *

UNITED STATES PATENT AND TRADEMARK OFFICE
CERTIFICATE OF CORRECTION

PATENT NO.     : 6,752,662 B2
DATED          : June 22, 2004
INVENTOR(S)    : Toshimune Okamoto It is certified that error appears in the above-identified patent and that said Letters Patent is hereby corrected as shown below:

<u>Title page,</u>
Item [57], ABSTRACT,
Line 1, "mounted electrical has" should read -- mounted electrical connector has --

Signed and Sealed this

Fifth Day of April 2005

JON W. DUDAS
*Director of the United States Patent and Trademark Office*